United States Patent [19]

Adair

[11] Patent Number: 4,777,108

[45] Date of Patent: Oct. 11, 1988

[54] TRANSFER IMAGING SYSTEM

[75] Inventor: Paul C. Adair, Springboro, Ohio

[73] Assignee: The Mead Corporation, Dayton, Ohio

[21] Appl. No.: 69,465

[22] Filed: Jul. 2, 1987

[51] Int. Cl.⁴ .......................... G03C 1/68; G03C 5/54
[52] U.S. Cl. ..................................... 430/138; 430/10; 430/21; 430/139; 430/211; 430/235; 430/933; 430/962
[58] Field of Search ............... 430/138, 139, 211, 235, 430/933, 962, 21; 503/218; 283/85, 92

[56] References Cited

U.S. PATENT DOCUMENTS

| | | | |
|---|---|---|---|
| 3,072,481 | 1/1963 | Berman et al. | 430/138 |
| 3,279,826 | 10/1966 | Rudershausen et al. | 283/92 |
| 4,269,627 | 5/1981 | Hwang | 106/22 |
| 4,399,209 | 8/1983 | Sanders et al. | 430/138 |
| 4,576,891 | 3/1986 | Adair et al. | 430/138 |
| 4,585,258 | 4/1986 | Detty | 430/270 |
| 4,587,194 | 5/1986 | Adair et al. | 430/138 |
| 4,622,282 | 11/1986 | Head et al. | 430/138 |
| 4,634,148 | 1/1987 | Greene | 283/92 |

Primary Examiner—Richard L. Schilling
Attorney, Agent, or Firm—Smith & Schnacke

[57] ABSTRACT

The present invention provides a transfer imaging sheet wherein an image is invisible in visible light but apparent under ultraviolet or infrared radiation. The transfer imaging sheet comprises an imaging sheet having a coating on one surface thereof of an image forming agent selected from the group consisting of an ultraviolet-readable fluorescer and an infrared-readable dye, and a radiation curable composition which undergoes an increase in viscosity upon exposure to actinic radiation. The radiation curable composition is encapsulated in rupturable microcapsules as an internal phase, and preferably, the image forming agent is encapsulated with the radiation curable composition. Images are formed by image-wise exposing the coating to actinic radiation and rupturing the microcapsules in the image areas with the coating in facial contact with a receiver sheet such that the internal phase is image-wise released from the ruptured microcapsules and is transferred to the receiver sheet to form an image on the receiver sheet. The image is then read under ultraviolet radiation with the naked eye or infrared radiation with an instrument designed to read the image.

14 Claims, 1 Drawing Sheet

4,777,108

TRANSFER IMAGING SYSTEM

BACKGROUND OF THE INVENTION

The present invention relates to photosensitive imaging systems of the type which employs microcapsules containing radiation curable compositions in the internal phase. More particularly, the present invention relates to a transfer imaging system wherein the images formed are ultraviolet-readable or infrared-readable.

Photosensitive imaging systems employing microencapsulated radiation curable compositions are the subject of commonly assigned U.S. Pat. Nos. 4,399,209 and 4,440,846 as well as co-pending U.S. patent application Ser. No. 339,917 filed Jan. 18, 1982. These imaging systems are characterized in that an imaging sheet including a layer of microcapsules containing a radiation curable composition in the internal phase is image-wise exposed to actinic radiation. In the most typical embodiments, the radiation curable composition includes a polyethylenically unsaturated compound and a photoinitiator, and is encapsulated with a color precursor. Exposure image-wise hardens the internal phase of the microcapsules. After exposure, the imaging sheet is subjected to a uniform rupturing force by passing the sheet through the nip between a pair of pressure rollers.

U.S. Pat. No. 4,399,209 discloses a transfer imaging system in which the imaging sheet is assembled with a developer sheet prior to being subjected to the rupturing force. Upon passing through the pressure rollers in contact with the developer sheet, the microcapsules image-wise rupture and release the internal phase whereupon the color precursor migrates to the developer sheet where it reacts with a dry developer material and forms a color image. The imaging system can be designed to reproduce monochromatic or polychromatic full color images.

The foregoing imaging systems produce visible-light visible images. The need exists for an imaging system which produces visible-light invisible images.

SUMMARY OF THE INVENTION

The present invention provides a transfer imaging sheet wherein visible-light invisible images are produced. The transfer imaging sheet comprises an imaging sheet comprising a first substrate. A coating on one surface of the imaging sheet comprises an image forming agent selected from the group consisting of an ultraviolet-readable fluorescer and an infrared-readable dye and a radiation curable composition which undergoes an increase in viscosity upon exposure to actinic radiation.

In a fluorescer, when a molecule undergoes absorption of ultraviolet or visible light, an electron is promoted from the ground state to an excited singlet state. Immediately after promotion, the electron drops to the lowest-energy excited singlet state. The excited molecule with its electrons in this lowest-energy singlet state can return to the ground state by losing energy as light. The energy lost by this emission of light is slightly less than the energy that was initially absorbed. Therefore, the wavelength of the light emitted is slightly longer than the wavelength that was initially absorbed. The term "ultraviolet-readable fluorescer" as used herein means that the fluorescer absorbs light in the ultraviolet region and emits light in the visible region so that an image is produced which is invisible in visible light but becomes visible under ultraviolet light to the naked eye.

The term "infrared-readable dye" as used herein means that the dye absorbs infrared light so that an image may be produced which is invisible in visible light but becomes visible in infrared light through an instrument designed to read the image. As those skilled in the art know, the human eye cannot detect infrared light.

The radiation curable composition is encapsulated in rupturable microcapsules as an internal phase. Preferably, the image forming agent is encapsulated with the radiation curable composition. Images are formed by image-wise exposing the coating on the imaging sheet to actinic radiation and rupturing the microcapsules in the image areas with the coating in facial contact with a receiver sheet such that the internal phase is image-wise released from the ruptured microcapsules and is transferred to the receiver sheet to form an image on the receiver sheet.

The image is then read under ultraviolet radiation, if an ultraviolet-readable fluorescer is used, or under infrared radiation with an instrument which can detect the image, if an infrared-readable dye is used. The image can be read immediately after transfer of the internal phase to the receiver sheet or can be read at a later time. The transfer imaging sheet can produce monochrome or multicolor images.

The present invention also provides a transfer imaging process. An imaging sheet is image-wise exposed to actinic radiation. The imaging sheet comprises a first substrate and a coating composition on one surface thereof. The coating composition includes an image forming agent selected from the group consisting of an ultraviolet-readable fluorescer and an infrared-readable dye and a radiation curable composition which undergoes an increase in viscosity upon exposure to actinic radiation. The radiation curable composition is encapsulated in rupturable microcapsules as an internal phase. Preferably, the image forming agent is encapsulated with the radiation curable composition.

The microcapsules are ruptured in the image areas and the internal phase is transferred to a receiver sheet to form an image. The image is then read under ultraviolet radiation, if an ultraviolet-readable fluorescer is used, or under infrared radiation with an instrument which can detect the image, if an infrared-readable dye is used.

The present invention also provides another transfer imaging process. A transfer imaging sheet is image-wise exposed to actinic radiation. The imaging sheet comprises a first substrate and a coating composition on the surface thereof. The coating composition includes a non-fluorescing ultraviolet absorber and a radiation curable composition which undergoes an increase in viscosity upon exposure to actinic radiation. The radiation curable composition is encapsulated in rupturable microcapsules as an internal phase. Preferably, the non-fluorescing ultraviolet absorber is encapsuled with the radiation curable composition.

The microcapsules are ruptured in the image areas and the internal phase is transferred to a receiver sheet having fluorescent brighteners incorporated therein to form an image on the receiver sheet. The image is then read under ultraviolet radiation.

Thus, an object of the present invention is to provide a transfer imaging sheet and process wherein monochrome images are produced which are invisible under visible light illumination but become apparent under ultraviolet illumination to the naked eye or infrared illumination by an instrument which can detect the image.

Another object of the present invention is to provide a transfer imaging sheet and process wherein the transfer imaging sheet is a security document.

A further object of the present invention is to provide a transfer imaging sheet and process wherein an image is transferred onto a receiver sheet to form a device which is useful for amusement purposes.

Other objects and advantages of the present invention will become apparent from the following description, the attached drawings, and the appended claims.

DEFINITIONS

The term "document" as used herein includes negotiable instruments such as bills of lading, checks, travelers checks, postal orders, lottery tickets, trading checks, bearer bonds, and the like as well as documents such as admission tickets, badges, bank notes, credit cards, passports, and travel tickets.

The term "harden" as used herein refers to polymerizing and thereby gelling, solidifying, or otherwise immobilizing the internal phase of the microcapsules.

The term "image areas" as used herein means the areas in which the internal phase is released from the microcapsules regardless of whether the image formed is a positive or a negative image.

DETAILED DESCRIPTION OF THE INVENTION

Figure 1:
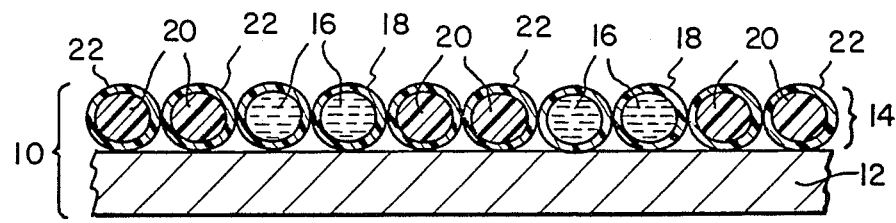
FIG. 1 is a cross-sectional view of a field of microcapsules after image-wise exposure in accordance with one embodiment of the present invention.

FIG. 1 is a cross-sectional view through a field of microcapsules after image-wise exposure in accordance with the present invention. Herein, imaging sheet 10 comprises a substrate 12 having a layer of microcapsules 14 on the surface thereof. The microcapsules contain an ultraviolet-readable fluorescer or an infrared-readable dye and a radiation curable composition which undergoes an increase in viscosity upon exposure to actinic radiaton. Thus, upon exposing the layer of microcapsules 14 to actinic radiation, the internal phase 16 of the unexposed microcapsules 18 remains liquid while the internal phase 20 of the exposed microcapsules 22 increases in viscosity. For illustration purposes, the internal phase 20 is shown as hardening; however, the internal phase 20 may simply be converted to a more viscous, gelatinous, or semi-solid state. Thus, after exposure, the layer of microcapsules 14 bears an image in the form of microcapsules 18 which contain a still liquid internal phase 16.

When pressure is applied to microcapsules 22 in the exposed areas, the microcapsules 22 do not release their internal phase 20. In the unexposed areas, microcapsules 18 rupture and release their internal phase 16 whereupon the ultraviolet-readable fluorescer or infrared-readable dye migrates to a receiver sheet to form an image.

When the image forming agent is to be an ultraviolet-readable fluorescer, any fluorescer which is invisible in visible light but is visible in ultraviolet light is useful in the present invention. It is possible to form a multicolor image based on fluorescers. Examples of useful ultraviolet-readable blue fluorescers are stilbene derivatives such as 4,4'-bis(triazin-2-ylamino)stilbene-2,2'-disulfonic acids, mono(azol-2-yl)stilbenes including 2-(stilben-4-yl)naphthotriazoles and 2-(4-phenylstilben-4-yl)benzoxazoles, and bis(azol-2-yl)stilbenes; styryl derivatives of benzene and biphenyl such as 1,4-bis(-styryl)benzenes and 4,4'-bis(styryl) biphenyls; pyrazolines such as 1,3-diphenyl-2-pyrazolines; bis(benzazol-2-yl) derivatives such as bis(benzoxazol-2-yl) derivatives, bis(benzimidazol-2-yl) deriatives, and 2-(benzofuran-2-yl)benzimidazoles; coumarins such as 7-hydroxy and 7-(substituted amino) coumarins, and 3-phenyl-7-(triazin-2-ylamino) coumarins; carbostyrils; naphthalimides; derivatives of dibenzothiophene-5,5-dioxide; pyrene derivatives; pyridotriazoles; diphenylanthracene; and quinine. Examples of useful ultraviolet-readable green fluorescers are decacyclene; 1,8-diphenyl-1,3,5,7-octatetraene; 2-aminoanthracene; 3-aminofluoranthene; and 2-o-hydroxyphenylbenzothiazole. A useful ultraviolet-readable red fluorescer is available from Mitsu Toatsu under the desigaation ER-105.

When the image forming agent is to be an infrared-readable dye, any dye which is invisible in visible light but becomes visible in infrared light through an instrument designed to read the image is useful in the present invention. Examples of useful infrared-readable dyes are the higher vinylogues of thiacyanines of the following formula (I):

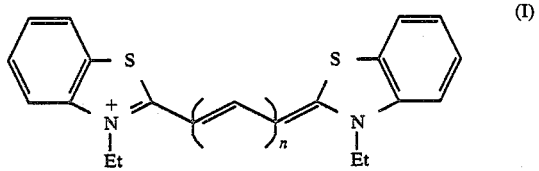

wherein n is 3 or 4.

In accordance with the present invention, the ultraviolet-readable fluorescer or infrared-readable dye is incorporated in the internal phase in an amount sufficient to produce a visible image in ultraviolet or infrared light of the desired density upon transfer to the receiver sheet. In general, about 0.1 to 10.0% ultraviolet-readable fluorescer or infrared-readable dye based on the weight of the internal phase solution, e.g., monomer or monomer and oil, is used.

Radiation curable compositions useful in the present invention usually include a photoinitiator in combination with a monomer, a dimer, or an oligomer which is polymerizable to a higher molecular weight, or a polymer which is crosslinked upon exposure.

Ethylenically unsaturated organic compounds are useful radiation curable materials. These compounds contain at least one terminal ethylene group per molecule. Typically, liquid ethylenically unsaturated compounds having two or more terminal ethylene groups per molecule are preferred. Examples of this preferred subgroup are ethylenically unsaturated acid esters of polyhydric alcohols such as ethylene glycol dimethacrylate, triethylene glycol dimethacrylate, trimethylol propane triacrylate (TMPTA), and trimethylol propane trimethacrylate. Another example of a useful radiation curable composition is an acrylate prepolymer derived from the partial reaction of pentaerythritol with acrylic acid, methacrylic acid, or acrylic or methacrylic acid esters. Another group of substances useful as radiation curable compositions include isocyanate modified acrylic, methacrylic, and itaconic acid of esters of polyhydric alcohols.

In most cases, the radiation curable composition includes a photoinitiator. It is possible to use either homolytic photoinitiators which are converted to an active species by radiation and generate a radical by abstracting a hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be the anionic of cation generating type depending upon the nature of the polymerization.

Examples of photoinitiators useful in the present invention include diaryl ketone derivatives and benzoin alkyl ethers. The photoinitiator is selected based upon the sensitivity of the system that is desired.

Where ultraviolet sensitivity is desired, suitable photoinitiators include alkoxy phenyl ketones, o-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases, it is advantageous to use a combination of photoinitiators.

Where visible light sensitivity is desired, see commonly assigned U.S. patent application Ser. Nos. 917,873 filed Oct. 10, 1986 and 944,305 filed Dec. 18, 1986.

The amount of photoinitiator which is used in the radiation curable composition depends upon the particular radiation curable material selected. It must be present in an amount sufficient to initiate the photochemistry within a short exposure time. The photoinitiator may be used to sequester oxygen which is present in the microcapsules and inhibits polymerization by conducting a non-imaging, oxygen sequestering pre-exposure or co-exposure. When the photoinitiator is also relied upon for sequestering oxygen, it must be used in amounts sufficient to fulfill this function and its imaging function.

In addition to the ultraviolet-readable fluorescer or the infrared-readable dye and the radiation curable composition, the internal phase of the microcapsules may also include a carrier oil. Preferred carrier oils are weakly polar solvents having boiling points above 170°, and preferably, in the range of about 180° to 300° C. The carrier oils used in the present invention are typically those conventionally used in carbonless paper manufacture. However, a carrier oil is not always necessary. Whether a carrier oil should be used will depend upon the solubility of the ultraviolet-readable fluorescer or the infrared-readable dye in the radiation curable composition before exposure, the nature of the ultraviolet-readable fluorescer or the infrared-readable dye, and the viscosity characteristics of the internal phase. When present, examples of useful carrier oils are alkylated biphenyls, e.g., monoisopropylbiphenyl; poly-chlorinated biphenyls; castor oil; mineral oil; deodorized kerosene; naphthenic mineral oils; dibutyl phthalate; dibutyl fumerate; brominated paraffin and mixtures thereof. Alkylated biphenyls are generally less toxic and preferred.

The presence of a carrier oil affects and can be used to control the tonal quality of the images obtained. While tonal quality, i.e, half-tone gradation, is not critical when copying printed documents, it is an important factor in faithfully producing pictorial images.

Useful wall-forming materials for the microcapsules include gelatin wall-forming materials (see U.S. Pat. Nos. 2,730,456 and 2,800,457) including gum arabic, polyvinyl alcohol, carboxylmethylcellulose; resorcinol-formaldehyde wall-formers (see U.S. Pat. No. 3,755,190); isocyanate wall-formers (see U.S. Pat. No. 3,914,511); isocyanate-polyol wall-formers (see U.S. Pat. No. 3,796,669); urea-formaldehyde wall-formers, and more particularly, urea-resorcinol-formaldehyde wall-formers (in which oleophilicity is enhanced by the addition of resorcinol) (see U.S. Pat. Nos. 4,001,140; 4,087,376; and 4,089,802); melamine-formaldehyde resin; and hydroxypropyl cellulose (see commonly assigned U.S. Pat. No. 4,025,455). To the extent necessary for complete disclosure of wall-forming materials, the above-mentioned patents are specifically incorporated by reference.

The wall-forming material used in the given imaging system is selected based on the radiation curable composition present in the internal phase. Thus, the formed capsule wall must be transmissive to the exposure radiation. Of the above systems, urea-resorcinol-formaldehyde and gelatin microcapsules are preferred.

Microencapsulation of the internal phase can be accomplished by a variety of known techniques. Useful techniques include coacervation, interfacial polymerization, polymerization of one or more monomers in an oil as well as various melting, dispersing, and cooling methods.

The mean size of the microcapsules used in the present invention generally ranges from about 1 to 25 microns. As a general rule, image resolution improves as the microcapsule size decreases with the caveat that if the microcapsule size is too small, depending upon the nature of the substrate on which the microcapsules are coated, the microcapsules may disappear into the pores or the fiber in the substrate but even microcapsules as large as 25 microns provide satisfactory resolution in the present invention. In the latter case, the incongruities in the substrate may screen microcapsules from exposure, and thereby diminish image quality. The microcapsules may also fail to rupture upon the application of pressure. In view of the foregoing, a preferred mean microcapsule size range is about 3 to 5 microns, and particularly, about 3 to 10 microns although technically, the microcapsules can range in size up to the point that they are visible to the human eye.

Typically, the microcapsules will be combined with a binder prior to coating on a substrate. Useful binders include gelatin, polyvinyl alcohol, polyacrylamide, and acrylic latices.

The coating compositions are applied and dried on a continuous web of paper or a synthetic film. Any ordinary coating or printing technique can be used in making transfer imaging sheets in accordance with the present invention including such means as roller or blade coating. The paper may be of commercial impact raw stock or a special grade paper such as a cast-coated paper and chrome rolled paper. The latter examples are desirable when using very fine microcapsules, e.g., microcapsules ranging in size from approximately 1 to 5 microns, as the surface of these papers is smoother and the microcapsules are not as easily embedded in the stock fibers. Transparent substrates such as polyethylene terephthalate and translucent substrates can also be used in the invention.

The image-wise exposure time may range up to about 1 minute but is preferably in the order of 1 to several seconds or less. The actual exposure time will also depend on a number of variables such as the coating weight, coating thickness, the radiation curable photosensitive composition, the type and source of radiation, the radiation intensity, and the radiation source distance from the imaging sheet. Any useful source of electromagnetic radiation can be used in the present invention.

After image-wise exposure, the microcapsules are ruptured. Any commercially available pressure application developer means are useful in the present invention. Preferred pressure application developer means are disclosed in commonly assigned U.S. patent application Ser. Nos. 009,851, filed Feb. 2, 1987 and 039,393, filed Apr. 16, 1987.

Typically, the transfer imaging sheet is joined with a receiver sheet prior to microcapsule rupture. Typically, the substrate of the receiver sheet is paper. For transparencies, a transparent substrate such as Mylar film may also be used.

To the extent necessary to complete this disclosure, commonly assigned U.S. Pat. Nos. 4,399,209 and 4,440,846 as well as copending application Ser. No. 339,917 filed Jan. 18, 1982 are herein incorporated by reference.

Unlike conventional systems wherein a dye precursor requires a zincated or acidic developer material in order to form an image, a developer material is not required by the present invention because an ultraviolet-readable fluorescer or an infrared-readable dye is used.

The image is then read under ultraviolet radiation, if an ultraviolet-readable fluorescer is used, or under infrared radiation, if an infrared-readable dye is used. The image can be read immediately after microcapsule rupture and internal phase transfer to the receiver sheet or at a later time as desired. Any commercially available source of ultraviolet radiation is useful in reading the image of the present invention.

Infrared readable dyes cannot be read with the human eye. Instrumentation is required. A typical instrument which can detect an infrared image has an infrared source, a photodetector, and a read-out device. Useful sources of infrared radiation include infrared lasers or laser diodes. The infrared-readable dye can be tuned to match the output of a specific infrared laser. For example, yttrium-aluminum-garnet (YAG) lasers emit at 1.06 nm and gallium-arsenic semiconductors emit at 0.905 nm at room temperature.

When using an ultraviolet-readable fluorescer or an infrared-readable dye, a faint image may be noticed on the receiver sheet under visible illumination due to a differential wetting of the receiver sheet. A method for alleviating this problem consists of a mixture of microcapsules containing monomer but no photoinitiator nor fluorescer and microcapsules containing monomer, photoinitiator, and fluorescer. In this manner, liquid will be transferred everywhere that the imaging sheet was in contact with the receiver sheet, and thereby, allowing no visible differential liquid image. Fluorescer would be transferred only where the radiation curable microcapsules were not exposed to actinic radiation.

A number of paper bases incorporate fluorescent brighteners therein. As such in another embodiment, a non-fluorescing ultraviolet absorber would be encapsulated with the radiation curable composition and a photoinitiator which is not greatly affected by the absorber. Upon transfer to a receiver sheet possessing fluorescent brighteners, an image could be read-out under ultraviolet radiation. Useful fluorescent brighteners include stilbene derivatives; styryl derivatives of benzene and biphenyl; pyrazolines; bis(benzazol-2-yl) derivatives; coumarins; carbostyrils; naphthalimides; derivatives of dibenzothiophene-5,5-dioxide; pyrene derivatives; and pyridotriazoles.

The present invention is useful in document security applications or simply for amusement. For example, the transfer imaging sheet could be a negotiable instrument such as a bill of lading, a check, a travelers check, a postal order, a trading check, a bearer bond, and the like, as well as documents such as an admission ticket, a badge, a bank note, a credit card, a lottery ticket, a passport, and a travel ticket. Depending upon the application, the image will be in the form of an identification number, signature, or a likeness of a person authorized to negotiate or possess the negotiable instrument or document.

Figure 2:
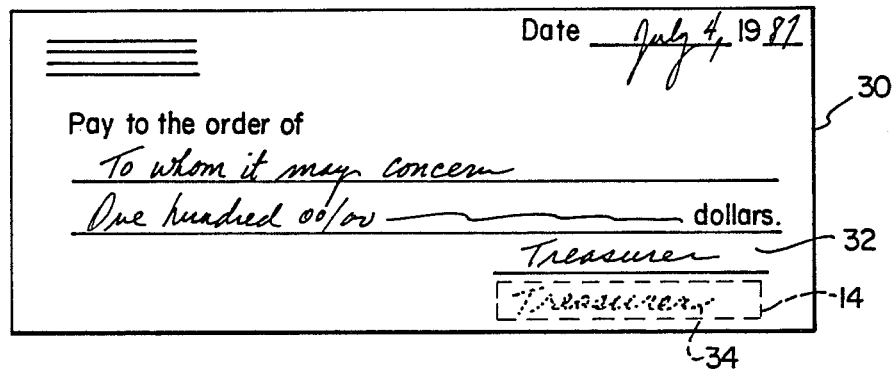
FIG. 2 is an overhead perspective view of the front face of a negotiable instrument in accordance with the present invention.
Figure 3:
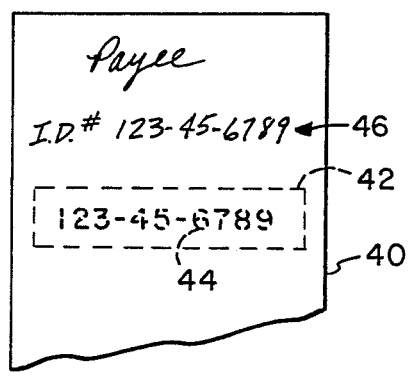
FIG. 3 is an overhead perspective view of the back side of another negotiable instrument in accordance with the present invention.
Figure 4:
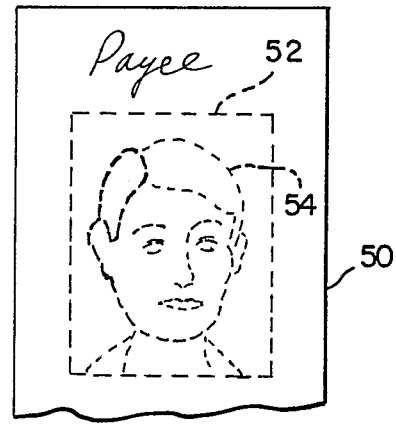
FIG. 4 is an overhead perspective view showing another embodiment of the present invention.

FIGS. 2–4 illustrate the use of the present invention in document security applications. FIG. 2 illustrates a negotiable instrument 30 in accordance with the present invention having a layer of microcapsules 14 on the face thereof below the drawer's signature 32. The layer of microcapsules 14 is shown as containing an image of the authorized drawer's signature as indicated by phantom line 34. Upon presentment, a cashier, teller, or the like ruptures the layer of microcapsules 14 in facial contact with a receiver sheet and reads the image under ultraviolet or infrared radiation so that the drawer's signature 32 can be compared to the authorized drawer's signature 34 for authentication purposes. It should be understood that the authorized drawer's signature 34 on the receiver sheet will be the reverse of the authorized drawer's signature 34 as it appears on the negotiable instrument 30. A transparent receiver sheet can be used to simplify the authentication process.

FIGS. 3 and 4 illustrate the back side of two instruments 40 and 50 carrying microcapsule layers 42 and 52 respectively. In accordance with the embodiment illustrated in FIG. 3, the microcapsules carry a latent image of an identification number of the authorized payee 44. After the payee writes his identification number 46 on the back side of the instrument 40 and upon presentment, a cashier, teller, or the like ruptures the layer of microcapsules 42 in facial contact with a receiver sheet and reads the image under ultraviolet or infrared radiation so that identification number 46 can be compared to the identification number of the authorized payee 44 for authentication purposes. It should be understood that the identification number of the authorized payee 44 on the receiver sheet will be the reverse of the identification number of the authorized payee 44 as it appears on the negotiable instrument 40. A transparent receiver sheet can be used to simplify the authentication process.

In FIG. 4, the layer of microcapsules 52 contains an actual image of the authorized payee 54. Upon presentment, a cashier, teller, or the like ruptures the layer of microcapsules 52 in facial contact with a receiver sheet and reads the image under ultraviolet or infrared radiation so that the payee making presentment can be compared to the actual image of the authorized payee 54 for authentication purposes. It should be understood that the actual image of the authorized payee 54 on the receiver sheet will be the reverse of the actual image of the authorized payee 54 on the negotiable instrument 50. A transparent receiver sheet can be used to simplify the authentication process.

The present invention is useful in document security systems because a latent verification image can be applied to the document by photographic techniques. As a result, verification means can be applied at the same time that the documents are cut or drafted. For example, payroll checks provided with a layer of microcapsules on the backside can be exposed to provide an image of the employee's signature at the same time that the checks are completed.

The document can also be prepared by image-wise exposing a transfer imaging sheet to form an identification number, signature, or likeness of a person. The microcapsules would then be ruptured and the internal phase would be transferred to a receiver sheet which would then be further processed in order to prepare a document. Upon presentment of the document, a cashier or teller would simply read the image under ultraviolet radiation or through an infrared reader.

The present invention is more fully illustrated by the following non-limiting Examples.

EXAMPLE 1

Standard Mead Imaging MF microcapsules were made which contained an optical brightener in the internal phase:
50 g TMPTA
1.0 g isopropyl thioxanthone (Ward Blenkinsop)
2.0 g ethyl-p-dimethylaminobenzoate (Ward Blenkinsop)
2.5 g Uvitex OB (Ciba-Geigy)

The resultant capsule emulsion was diluted to 20% solids and coated on 80 lb. Black and White Glossy with a #12 wire-wound rod. The dried sheet was exposed for 8 seconds by one F15T8-BL fluorescent tubeaat a distance of 12 cm through a step wedge.

The resultant capsule sheet was brought into pressured contact with a sheet of paper which contained no optical brightener (graph paper made by Keuffel and Esser Co.) A clear image was seen under illumination by an F15T8-BLB tube, being blue where internal phase was transferred. No image was seen under white light.

EXAMPLE 2

Capsules containing UV absorber were made with the following internal phase:
50 g TMPTA
1.0 g isopropyl thioxanthone
2.0 g ethyl-p-dimethylaminobenzoate
3.0 g N-(p-Ethoxycarbonylphenyl)-N'-ethyl-N'-phenyl formamidine (Givsorb UV-2, Givaudan)

The resultant capsule emulsion was diluted to 20% solids with 2.5% Klucel L and coated as above. The dried capsule sheet was exposed through a step wedge for 8 seconds by one F15T8-BL tube at a distance of 12 cm.

The exposed capsule sheet was brought into pressured contact with a sheet of paper which possessed an optical brightener (Mead 80 lb Black and White Glossy). A clear image was seen under illumination by one F15T8-BLB tube, being blue where no capsule internal phase was transferred. Under white light, no image was apparent.

EXAMPLE 3

A piece of paper which contained no optical brightener was coated with a solution of 20 g acetone and 0.25 g of ER-105 red fluorescent dye from Mitsu Toatsu. The capsules described in Example 2 were exposed and developed against this sheet. A clear image was seen under UV illumination being red where no capsule internal phase was transferred. Under white-light, no image was apparent.

EXAMPLE 4

A sheet of paper which contained no optical brightener was coated with a solution of 20 g acetone and 0.5 g of 2-ortho-hydroxybenzothiazole. The capsules described in Example 2 were exposed and developed against this sheet. A clear image was seen under UV illumination, being green where no capsule internal phase had transferred. No image was apparent under white light.

EXAMPLE 5

Microcapsules were made and coated as in Example 1, but the internal phase contained 0.5 g of 9,10-diphenylanthracene instead of Uvitex OB as the fluorescent agent. Capsules were exposed through a step wedge and transferred to a sheet containing no fluorescent brightener. Under UV illumination, a blue image was seen where the internal phase had transferred, while no image was seen under white light.

EXAMPLE 6

Microcapsules were made and coated as in Example 1, but contained 0.5 g of 2(4-biphenylyl)-5-phenyl-1,3,4-oxadiazole as a blue fluorescer instead of Uvitex OB. Capsules were exposed through a step wedge and transferred to a sheet containing no fluorescent brightener. Under UV illumination, a blue image was seen where internal phase had transferred, while no image was seen under white light.

EXAMPLE 7

Microcapsules were made as in Example 1, but contained 0.5 g of 2-ortho-hydroxyphenylbenzothiazole instead of Uvitex OB as the fluorescent agent. Upon exposure and transfer to a sheet containing no optical brightener, a green image was seen where internal phase had transferred. No image was seen under white light.

EXAMPLE 8

A 2-color system based on fluorescent dyes was prepared as follows.

Capsule Batch A was made as in Example 1, with Uvitex OB acting as a blue-fluorescent dye. The isopropylthioxanthone in these capsules possesses a peak sensitivity at about 390 nm. Capsule Batch B contained the following internal phase:
50 g TMPTA
3.0 g Quanticure BMS (Ward-Blenkinsop)
2.0 g Quanticure EPD (Ward-Blenkinsop)
6.0 g Irgacure 907 (Ciba-Geigy)
1.0 g 2-(o-hydroxyphenyl) benzothiazole The initiators are maximally active at about 350 nm and the benzothiazole is a green-fluorescer (see Example 7).

The following mixture was coated on 80 lb. black and white glossy with a no. 12 Meyer bar:
10 g Capsule Batch A
10 g Capsule Batch B
10 g 11.5% Vinol 205
5 g Water
8 drops Triton X-100

Upon drying, one piece of the resultant capsule sheet was exposed on a Kratos MIS 1000 Illuminator System at 350 nm (20 nm bandpass) for 16 seconds through a Stauffer step tablet at distance of 40 cm from the monochromator. The B capsules attained Dmin at step 12, while the A capsules attained Dmin at step 8. From step 0–8, no image was seen. From step 8–12, a blue image was seen. Beyond step 12, a blue-green image was seen.

A second piece of the capsule sheet was exposed at 400 m for 16 seconds. From step 0–5, no image was seen. From step 5–12, a green image was seen. Beyond step 12, a blue-green image was seen.

Having described the invention in detail and by reference to preferred embodiments thereof, it will be apparent that modifications and variations are possible without departing from the scope of the invention defined in the appended claims.

What is claimed is:

1. A transfer imaging sheet comprising:
   an imaging sheet comprising a first substrate;
   an image forming agent selected from the group consisting of an ultraviolet-readable fluorescer and an infrared-readable dye;
   a radiation curable composition which undergoes an increase in viscosity upon exposure to actinic radiation;
   a coating on one surface of said first substrate comprising said ultraviolet-readable fluorescer or said infrared-readable dye and said radiation curable composition;
   said radiation curable composition being encapsulated in rupturable microcapsules as an internal phase wherein images are formed by image-wise exposing said coating to actinic radiation and rupturing microcapsules in the image areas with said coating in facial contact with a receiver sheet, such that said internal phase is image-wise released from said ruptured microcapsules and is transferred to said receiver sheet to form an image on said receiver sheet and said image is read under ultraviolet or infrared radiation.

2. The transfer imaging sheet of claim 1 wherein said image forming agent is encapsulated with said radiation curable composition.

3. The transfer imaging sheet of claim 1 wherein said image forming agent is an ultraviolet-readable fluorescer.

4. The transfer imaging sheet of claim 1 wherein said image forming agent is an infrared-readable dye.

5. The transfer imaging sheet of claim 1 wherein said transfer imaging sheet is a document selected from the group consisting of a badge, a bill of lading, a check, a credit card, a passport, or a ticket.

6. A transfer imaging process comprising the steps of:
   image-wise exposing a transfer imaging sheet to actinic radiation wherein said imaging sheet comprises a first substrate and a coating composition on one surface of said substrate, said coating composition including an image forming agent selected from the group consisting of an ultraviolet-readable fluorescer and an infrared-readable dye, and a radiation curable composition which undergoes an increase in viscosity upon exposure to actinic radiation, said radiation curable composition being encapsulated in rupturable microcapsules as an internal phase;
   rupturing microcapsules in the image areas;
   transferring said internal phase and said image-forming agent to a receiver sheet to form an image on said receiver sheet; and
   reading said image under ultraviolet or infrared radiation.

7. The transfer imaging process of claim 6 wherein said image forming agent is encapsulated with said radiation curable composition.

8. The transfer imaging process of claim 6 wherein said image forming agent is an ultraviolet-readable fluorescer.

9. The transfer imaging process of claim 6 wherein said image forming agent is an infrared-readable dye.

10. The transfer imaging process of claim 6 wherein said transfer imaging sheet is a document selected from the group consisting of a badge, bill of lading, a check, a credit card, a passport, or a ticket.

11. The transfer imaging process of claim 10 wherein said step of transferring said internal phase to said receiver sheet forms an image of an identification number, a signature, or a likeness of a person authorized to negotiate or possess said document.

12. The transfer imaging process of claim 6 wherein said ultraviolet-readable fluorescers form a multicolor image.

13. A transfer imaging process comprising the steps of:
    image-wise exposing a transfer imaging sheet to actinic radiation wherein said imaging sheet comprises a first substrate and a coating composition on the surface thereof, said coating composition including a non-fluorescing ultraviolet absorber and a radiation curable composition which undergoes an increase in viscosity upon exposure to actinic radiation, said radiation curable composition being encapsuled in rupturable microcapsules as an internal phase;
    rupturing microcapsules in the image areas;
    transferring said internal phase to a receiver sheet having fluorescent brighteners incorporated therein to form an image on said receiver sheet; and
    reading said image under ultraviolet radiation.

14. The transfer imaging process of claim 13 wherein said non-fluorescing ultraviolet absorber is encapsulated with said radiation curable composition.

* * * * *